United States Patent
Son et al.

(10) Patent No.: US 11,157,354 B2
(45) Date of Patent: Oct. 26, 2021

(54) DYNAMIC RANDOM ACCESS MEMORY DEVICES AND MEMORY SYSTEMS HAVING THE SAME

(71) Applicant: Samsung Electronics Co., Ltd., Suwon-si (KR)

(72) Inventors: Jong Pil Son, Seongnam-si (KR); Sin Ho Kim, Suwon-si (KR)

(73) Assignee: Samsung Electronics Co., Ltd.

( * ) Notice: Subject to any disclaimer, the term of this patent is extended or adjusted under 35 U.S.C. 154(b) by 0 days.

(21) Appl. No.: 16/947,383

(22) Filed: Jul. 30, 2020

(65) Prior Publication Data

US 2020/0356437 A1 Nov. 12, 2020

Related U.S. Application Data

(63) Continuation of application No. 16/152,807, filed on Oct. 5, 2018, now Pat. No. 10,769,010.

(30) Foreign Application Priority Data

Apr. 27, 2018 (KR) ........................ 10-2018-0048976

(51) Int. Cl.
*G06F 11/10* (2006.01)
*G11C 11/408* (2006.01)
(Continued)

(52) U.S. Cl.
CPC ........ *G06F 11/1004* (2013.01); *G11C 11/409* (2013.01); *G11C 11/4072* (2013.01); *G11C 11/4076* (2013.01); *G11C 11/4085* (2013.01); *G11C 11/4087* (2013.01); *G06F 3/0619* (2013.01); *G06F 11/1016* (2013.01); *G06F 12/0246* (2013.01); *G06F 12/1018* (2013.01); *H03M 13/09* (2013.01)

(58) Field of Classification Search
CPC ............ G06F 12/0246; G06F 11/1004; G06F 12/1018; G06F 3/0619; G06F 11/1016; H03M 13/09; G11C 11/4072; G11C 11/4076; G11C 11/4085; G11C 11/4087; G11C 11/409
See application file for complete search history.

(56) References Cited

U.S. PATENT DOCUMENTS 7,039,782 B2   5/2006  Garrett, Jr. et al.
8,284,792 B2   10/2012 Wang
(Continued)

*Primary Examiner* — Cynthia Britt
*Assistant Examiner* — Sazzad Hossain
(74) *Attorney, Agent, or Firm* — Myers Bigel, P.A.

(57) ABSTRACT

A DRAM device includes first terminals, second terminals, third terminals, a control signal generator, a CRC unit, a row decoder, a column decoder, and a memory cell array. The control signal generator generates a control signal. The CRC unit performs a first CRC logical operation on a first data group including qn-bit first data generated by inputting n-bit first data q times, generates a first CRC result signal, performs a second CRC logical operation on a second data group including qn-bit second data by inputting n-bit second q times, generates a second CRC result signal, and generates an error signal based on the first CRC result signal and the second CRC result signal. The error signal is generated based on the second CRC result signal regardless of the first CRC result signal in response to the control signal.

20 Claims, 11 Drawing Sheets

(51) Int. Cl.
*G11C 11/4076* (2006.01)
*G11C 11/4072* (2006.01)
*G11C 11/409* (2006.01)
*G06F 3/06* (2006.01)
*H03M 13/09* (2006.01)
*G06F 12/02* (2006.01)
*G06F 12/1018* (2016.01)

(56) References Cited

U.S. PATENT DOCUMENTS

| | | |
|---|---|---|
| 9,508,452 B2 | 11/2016 | Ryu et al. |
| 2003/0128579 A1 | 7/2003 | Sakimura et al. |
| 2004/0088497 A1 | 5/2004 | Deans et al. |
| 2007/0050530 A1 | 3/2007 | Rajan |
| 2009/0147882 A1 | 6/2009 | Rha |
| 2010/0238705 A1 | 9/2010 | Kim et al. |
| 2011/0176375 A1 | 7/2011 | Lee et al. |
| 2012/0023363 A1 | 1/2012 | Shaeffer et al. |
| 2014/0325105 A1 | 10/2014 | Prete et al. |
| 2014/0325178 A1 | 10/2014 | Przybylski et al. |
| 2016/0092307 A1 | 3/2016 | Bonen et al. |
| 2016/0092383 A1 | 3/2016 | Bains et al. |
| 2018/0121282 A1 | 5/2018 | Barrilado et al. |
| 2019/0050284 A1* | 2/2019 | Brown .................. G06F 3/0604 |

\* cited by examiner

FIG. 4

| BL TERMINAL | 0 | 1 | 2 | 3 | 4 | 5 | 6 | 7 | 8 | 9 |
|---|---|---|---|---|---|---|---|---|---|---|
| LDQP0 | d0 | d1 | d2 | d3 | d4 | d5 | d6 | d7 | CRC0 | 1 |
| LDQP1 | d8 | d9 | d10 | d11 | d12 | d13 | d14 | d15 | CRC1 | 1 |
| LDQP2 | d16 | d17 | d18 | d19 | d20 | d21 | d22 | d23 | CRC2 | 1 |
| LDQP3 | d24 | d25 | d26 | d27 | d28 | d29 | d30 | d31 | CRC3 | 1 |
| LDQP4 | d32 | d33 | d34 | d35 | d36 | d37 | d38 | d39 | CRC4 | 1 |
| LDQP5 | d40 | d41 | d42 | d43 | d44 | d45 | d46 | d47 | CRC5 | 1 |
| LDQP6 | d48 | d49 | d50 | d51 | d52 | d53 | d54 | d55 | CRC6 | 1 |
| LDQP7 | d56 | d57 | d58 | d59 | d60 | d61 | d62 | d63 | CRC7 | 1 |
| LDBIBP | d64 | d65 | d66 | d67 | d68 | d69 | d70 | d71 | 1 | |
| UDQP0 | d72 | d73 | d74 | d75 | d76 | d77 | d78 | d79 | CRC8 | 1 |
| UDQP1 | d80 | d81 | d82 | d83 | d84 | d85 | d86 | d87 | CRC9 | 1 |
| UDQP2 | d88 | d89 | d90 | d91 | d92 | d93 | d94 | d95 | CRC10 | 1 |
| UDQP3 | d96 | d97 | d98 | d99 | d100 | d101 | d102 | d103 | CRC11 | 1 |
| UDQP4 | d104 | d105 | d106 | d107 | d108 | d109 | d110 | d111 | CRC12 | 1 |
| UDQP5 | d112 | d113 | d114 | d115 | d116 | d117 | d118 | d119 | CRC13 | 1 |
| UDQP6 | d120 | d121 | d122 | d123 | d124 | d125 | d126 | d127 | CRC14 | 1 |
| UDQP7 | d128 | d129 | d130 | d131 | d132 | d133 | d134 | d135 | CRC15 | 1 |
| UDBIBP | d136 | d137 | d138 | d139 | d140 | d141 | d142 | d143 | 1 | |

FIG. 6

```
ILCRC0 = d69 ^ d68 ^ d67 ^ d66 ^ d64 ^ d63 ^ d60 ^
         d56 ^ d54 ^ d53 ^ d52 ^ d50 ^ d49 ^ d48 ^
         d45 ^ d43 ^ d40 ^ d39 ^ d35 ^ d34 ^ d31 ^
         d30 ^ d28 ^ d23 ^ d21 ^ d19 ^ d18 ^ d16 ^
         d14 ^ d12 ^ d8 ^ d7 ^ d6 ^ d0

ILCRC1 = d70 ^ d66 ^ d65 ^ d63 ^ d61 ^ d60 ^ d57 ^
         d56 ^ d55 ^ d52 ^ d51 ^ d48 ^ d46 ^ d45 ^
         d44 ^ d43 ^ d41 ^ d39 ^ d36 ^ d34 ^ d32 ^
         d30 ^ d29 ^ d28 ^ d24 ^ d23 ^ d22 ^ d21 ^
         d12 ^ d9 ^ d6 ^ d1 ^ d0

ILCRC2 = d71 ^ d69 ^ d68 ^ d63 ^ d62 ^ d61 ^ d60 ^
         d58 ^ d57 ^ d54 ^ d50 ^ d48 ^ d47 ^ d46 ^
         d44 ^ d43 ^ d42 ^ d39 ^ d37 ^ d34 ^ d33 ^
         d29 ^ d28 ^ d25 ^ d24 ^ d22 ^ d17 ^ d15 ^
         d13 ^ d12 ^ d10 ^ d8 ^ d6 ^ d2 ^ d1 ^ d0

ILCRC3 = d70 ^ d69 ^ d64 ^ d63 ^ d62 ^ d61 ^ d59 ^
         d58 ^ d55 ^ d51 ^ d49 ^ d48 ^ d47 ^ d45 ^
         d44 ^ d43 ^ d40 ^ d38 ^ d35 ^ d34 ^ d30 ^
         d29 ^ d26 ^ d25 ^ d23 ^ d18 ^ d16 ^ d14 ^
         d13 ^ d11 ^ d9 ^ d7 ^ d3 ^ d2 ^ d1

ILCRC4 = d71 ^ d70 ^ d65 ^ d64 ^ d63 ^ d62 ^ d60 ^
         d59 ^ d56 ^ d52 ^ d50 ^ d49 ^ d48 ^ d46 ^
         d45 ^ d44 ^ d41 ^ d39 ^ d36 ^ d35 ^ d31 ^
         d30 ^ d27 ^ d26 ^ d24 ^ d19 ^ d17 ^ d15 ^
         d14 ^ d12 ^ d10 ^ d8 ^ d4 ^ d3 ^ d2

ILCRC5 = d71 ^ d66 ^ d65 ^ d64 ^ d63 ^ d61 ^ d60 ^
         d57 ^ d53 ^ d51 ^ d50 ^ d49 ^ d47 ^ d46 ^
         d45 ^ d42 ^ d40 ^ d37 ^ d36 ^ d32 ^ d31 ^
         d28 ^ d27 ^ d25 ^ d20 ^ d18 ^ d16 ^ d15 ^
         d13 ^ d11 ^ d9 ^ d5 ^ d4 ^ d3

ILCRC6 = d67 ^ d66 ^ d65 ^ d64 ^ d62 ^ d61 ^ d58 ^
         d54 ^ d52 ^ d51 ^ d50 ^ d48 ^ d47 ^ d46 ^
         d43 ^ d41 ^ d38 ^ d37 ^ d33 ^ d32 ^ d29 ^
         d28 ^ d26 ^ d21 ^ d19 ^ d17 ^ d16 ^ d14 ^
         d12 ^ d10 ^ d6 ^ d5 ^ d4

ILCRC7 = d68 ^ d67 ^ d66 ^ d65 ^ d63 ^ d62 ^ d59 ^
         d55 ^ d53 ^ d52 ^ d51 ^ d49 ^ d48 ^ d47 ^
         d44 ^ d42 ^ d39 ^ d38 ^ d34 ^ d33 ^ d30 ^
         d29 ^ d27 ^ d22 ^ d20 ^ d18 ^ d17 ^ d15 ^
         d13 ^ d11 ^ d7 ^ d6 ^ d5
```

DYNAMIC RANDOM ACCESS MEMORY DEVICES AND MEMORY SYSTEMS HAVING THE SAME

CROSS-REFERENCE TO RELATED APPLICATION

This U.S. non-provisional patent application is a continuation of U.S. patent application Ser. No. 16/152,807, filed Oct. 5, 2018, which claims priority under 35 U.S.C. § 119 to Korean Patent Application No. 10-2018-0048976, filed on Apr. 27, 2018, in the Korean Intellectual Property Office (KIPO), the entire content of which is incorporated herein by reference.

BACKGROUND

Field

Devices and systems consistent with example embodiments relate to a dynamic random access memory (DRAM) devices and memory systems having the same.

Discussion of Related Art

Memory systems applied to a network apparatus may include a controller and a plurality of DRAM devices, which may be installed on a system board. The plurality of DRAM devices may be used for storing data. For example, the memory system may be configured to transmit 2n(k−1)-bit data (where k and n are positive integer values) and an n-bit error correction code (ECC) between the controller and k x2n DRAM devices. The controller may transmit a cyclic redundancy code (CRC) with the data when transmitting data to the k x2n DRAM devices, and each of the k x2n DRAM devices may perform a CRC logical operation.

SUMMARY

The example embodiments of the inventive concepts are directed to providing DRAM devices capable of controlling internal function blocks related to unused 8-bit data of an x2n DRAM device, and memory systems having the same.

The scope of the inventive concepts is not limited to the above-described embodiments, and other embodiments may be clearly understood by those skilled in the art from the following descriptions.

According to example embodiments, there is provided a DRAM device a including: first terminals through which n-bit first data and a first data strobe signal are input, where n is a positive integer; second terminals through which n-bit second data and a second data strobe signal are input; third terminals through which a row address and a column address are input; a control signal generator configured to generate a control signal; a CRC unit configured to perform a first CRC logical operation on a first data group including qn-bit first data generated by sequentially inputting the n-bit first data with the first data strobe signal q times, where q is a positive integer, generate a first CRC result signal, perform a second CRC logical operation on a second data group including qn-bit second data generated by sequentially inputting the n-bit second data with the second data strobe signal q times, generate a second CRC result signal, and generate an error signal based on the first CRC result signal and the second CRC result signal, wherein the error signal is generated based on the second CRC result signal regardless of the first CRC result signal in response to the control signal; a row decoder configured to decode the row address and generate a plurality of word selection signals; a column decoder configured to decode the column address and generate a plurality of column selection signals; and a memory cell array configured to store the first data group and the second data group in memory cells selected by the plurality of word selection signals and the plurality of column selection signals or store the second data group in response to the control signal.

According to example embodiments, there is provided a DRAM device including: first data terminals through which n-bit first data is input, where n is a positive integer; a first data strobe signal terminal through which a first data strobe signal is input; a first data bus inversion signal terminal through which a first data bus inversion signal is input; second data terminals through which n-bit second data is input; a second data strobe signal terminal through which a second data strobe signal is input; a second data bus inversion signal terminal through which a second data bus inversion signal is input; command and address terminals through which a row address or a column address is input; a control signal generator configured to detect the first data strobe signal and generate a control signal; a CRC unit configured to perform a first CRC logical operation on a first data group including qn-bit first data and a q-bit first data bus inversion signal generated by sequentially inputting n-bit first data with the first data strobe signal q times, where q is a positive integer, generate an n-bit first internal CRC, compare the first internal CRC and a first CRC, generate a first CRC result signal, perform a second CRC logical operation on qn-bit second data and a q-bit second data bus inversion signal generated by sequentially inputting n-bit second data with the second data strobe signal q times, generate an n-bit second internal CRC, compare the second internal CRC and a second CRC, generate a second CRC result signal, and generate an error signal based on the first CRC result signal and the second CRC result signal, wherein the error signal is generated based on the second CRC result signal regardless of the first CRC result signal in response to the control signal; a row decoder configured to decode the row address and generate a plurality of word selection signals; a column decoder configured to decode the column address and generate a plurality of column selection signals; and a memory cell array configured to store the qn-bit first data and the qn-bit second data in memory cells selected by the plurality of word selection signals and the plurality of column selection signals or store the qn-bit second data in response to the control signal, wherein the first CRC is applied through the first data terminals, and the second CRC is applied through the second data terminals.

According to example embodiments, there is provided a memory system including: a system board; a plurality of DRAM devices installed on the system board; and a controller installed on the system board, and configured to control the plurality of DRAM devices, wherein each of the plurality of DRAM devices comprises: first terminals through which n-bit first data and a first data strobe signal, where n is a positive integer, which are applied from the controller, are input; second terminals through which n-bit second data and a second data strobe signal, which are applied from the controller, are input; a control signal generator configured to generate a control signal; and a CRC unit configured to perform a first CRC logical operation on a first data group including qn-bit first data generated by sequentially inputting n-bit first data with the first data strobe signal q times, where q is a positive integer, generate a first CRC result signal, perform a second CRC logical operation on a second data group including qn-bit second data generated by sequentially inputting n-bit second data with the second data strobe signal q times, generate a second CRC result signal, and generate an error signal based on the first CRC result signal and the second CRC result signal, wherein the error signal is generated based on the second CRC result signal regardless of the first CRC result signal in response to the control signal.

BRIEF DESCRIPTION OF THE DRAWINGS

The accompanying drawings, which are included to provide a further understanding of the inventive concepts and are incorporated in and constitute a part of this application, illustrate certain embodiment(s) of the inventive concepts.

FIG. 4 is a table representing data and a CRC applied through data terminals and a data bus inversion signal terminal of an x2n DRAM device according to an example embodiment of the inventive concepts.

FIG. 6 illustrates logical equations of a lower CRC calculator according to an example embodiment of the inventive concepts.

DETAILED DESCRIPTION

Hereinafter, DRAM devices and memory systems having the same according to example embodiments of the inventive concepts will be described with reference to the accompanying drawings.

Figure 1:
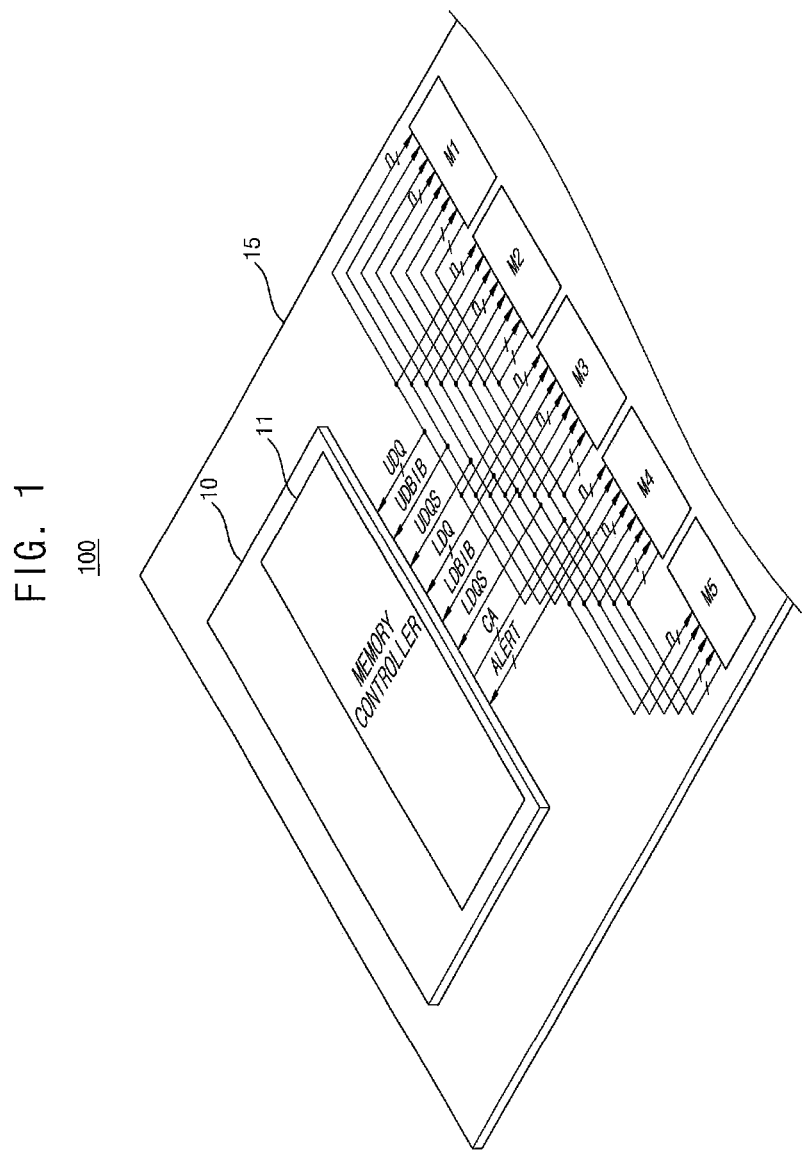
FIG. 1 is a block diagram illustrating a configuration of a memory system according to an example embodiment of the inventive concepts.

FIG. 1 is a block diagram illustrating a configuration of a memory system 100 according to an example embodiment of the inventive concepts. The memory system 100 may include a central processing unit (CPU) 10 and x2n DRAM devices M1 to M5, which are arranged on a system board 15. The CPU 10 may include a memory controller 11.

The memory controller 11 and each of the x2n DRAM devices M1 to M4 may receive and output an n-bit upper data signal UDQ and a 1-bit upper data bus inversion signal UDBIB with an upper data strobe signal UDQS. The memory controller 11 and each of the x2n DRAM devices M1 to M4 may also receive and output an n-bit lower data signal LDQ and a 1-bit lower data bus inversion signal LDBIB with a lower data strobe signal LDQS. 2n-bit data may be input and output between the memory controller 11 and each of the x2n DRAM devices M1 to M4. The upper data strobe signal UDQS may be transmitted with an inverted upper data strobe signal UDQSB, and the lower data strobe signal LDQS may be transmitted with an inverted lower data strobe signal LDQSB. The upper data bus inversion signal UDBIB may be a signal indicating an inversion of the n-bit upper data, and the lower data bus inversion signal LDBIB may be a signal indicating an inversion of the n-bit lower data.

The memory controller 11 and the x2n DRAM device M5 may receive and output an n-bit lower data signal LDQ and a lower data bus inversion signal LDBIB with the lower data strobe signal LDQS. Upper data terminals (e.g., related to the n-bit upper data signal UDQ), an upper data strobe signal terminal (e.g., related to the upper data strobe signal UDQS), and/or an upper data bus inversion signal terminal (e.g., related to the 1-bit upper data bus inversion signal UDBIB) of the x2n DRAM device M5 may be disconnected from the memory controller 11. The upper data terminals, the upper data strobe signal terminal, and/or the upper data bus inversion signal terminal of the x2n DRAM device M5 may remain in a floating state, or may be configured to be fixed to a predetermined voltage (for example, a power voltage or a ground voltage). That is, the upper data terminals, the upper data strobe signal terminal, and the upper data bus inversion signal terminal of the x2n DRAM device M5 may be configured to be disconnected from terminals or lines arranged on the system board 15, or to be connected to a predetermined voltage terminal or line.

A total of 9n-bit data may be transmitted between the memory controller 11 and the x2n DRAM devices M1 to M5, and n bits of the 9n-bit data may be an error correction code (ECC). For example, when n is 9, a total of 72-bit data may be transmitted, a 1-bit ECC may be assigned to 8-bit data, and thus an 8-bit ECC may be assigned to 64-bit data. The ECC may be a hamming code.

The memory controller 11 may transmit a command and address CA to each of the x2n DRAM devices M1 to M5. Each of the x2n DRAM devices M1 to M5 may transmit an error signal ALERT to the memory controller 11.

Figure 2:
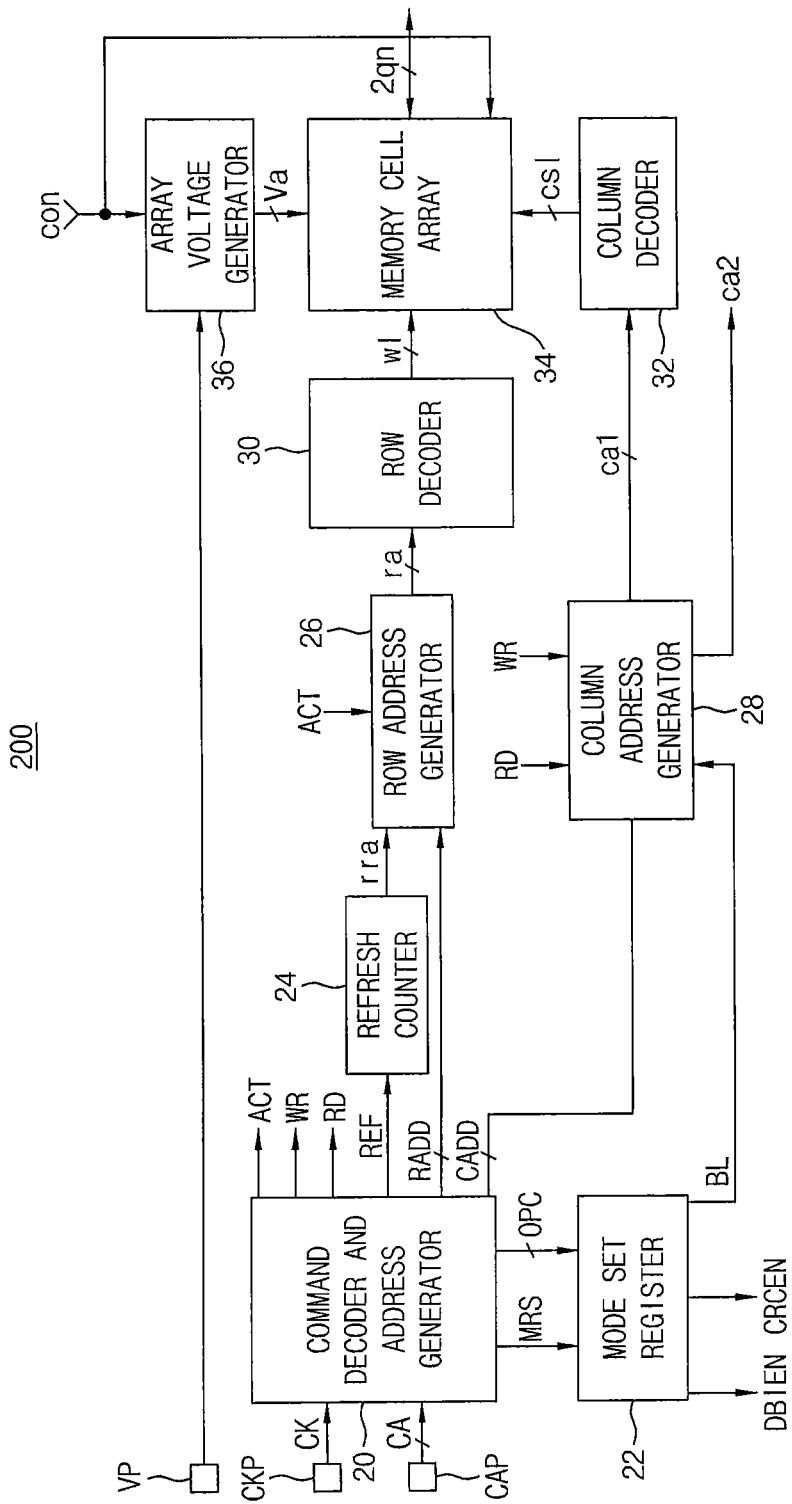
FIGS. 2 and 3 are diagrams illustrating a configuration of an x2n DRAM device according to an example embodiment of the inventive concepts.
Figure 3:
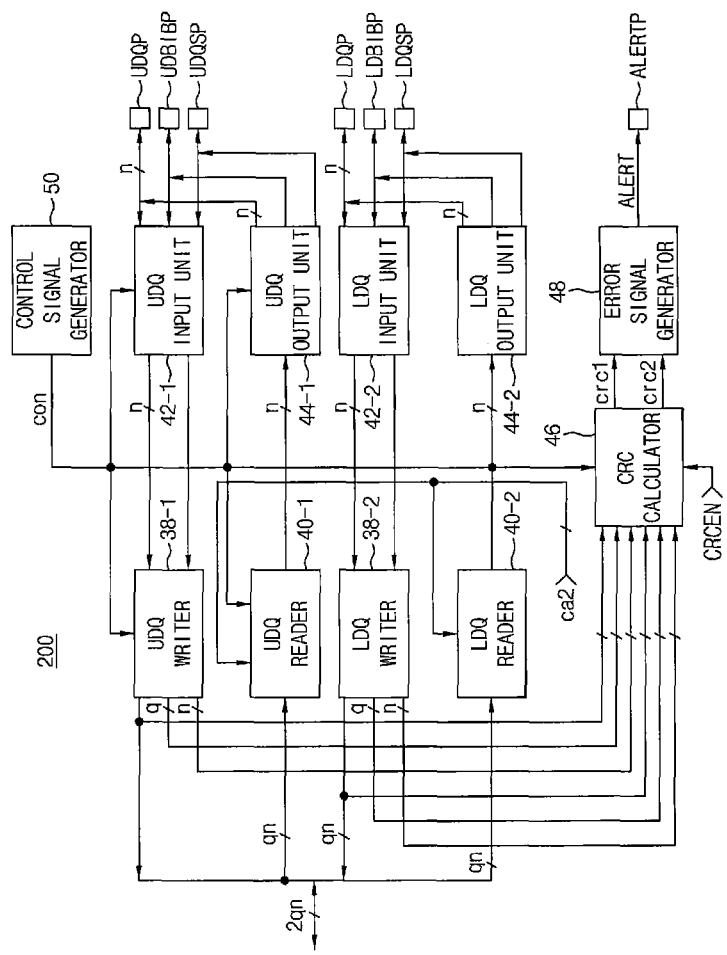

FIGS. 2 and 3 are diagrams illustrating a configuration of the x2n DRAM device 200 according to an example embodiment of the inventive concepts. The x2n DRAM device 200 may include a command decoder and address generator 20, a mode set register 22, a refresh counter 24, a row address generator 26, a column address generator 28, a row decoder 30, a column decoder 32, a memory cell array 34, an array voltage generator 36, an upper data (UDQ) writer 38-1, a lower data (LDQ) writer 38-2, a UDQ reader 40-1, an LDQ reader 40-2, a UDQ input unit 42-1, an LDQ input unit 42-2, a UDQ output unit 44-1, an LDQ output unit 44-2, a CRC calculator 46, and an error signal generator 48.

Further, the x2n DRAM device 200 may include voltage terminals VP through which a plurality of voltages, for example, a power supply voltage VDD, a ground voltage VSS, and/or a high voltage VPP, etc. are applied, a clock signal terminal CKP through which a clock signal CK is applied, command and address terminals CAP through which a command and address CA is applied, upper data terminals UDQP through which the n-bit upper data UDQ is input and output, lower data terminals LDQP through which the n-bit lower data LDQ is input and output, an upper data strobe signal terminal UDQSP through which the upper data strobe signal UDQS is input and output, a lower data strobe signal terminal LDQSP through which the lower data strobe signal LDQS is input and output, an upper data bus inversion signal terminal UDBIBP through which the upper data bus inversion signal UDBIB is input and output, a lower data bus inversion signal terminal LDBIBP through which the lower data bus inversion signal LDBIB is input and output, and an error signal terminal ALERTP through which the error signal ALERT is output.

A function of each of the blocks shown in FIGS. 2 and 3 will be described below.

The command decoder and address generator 20 may decode a command signal included in the command and address CA applied in response to the clock signal CK to generate a mode set command MRS, an active command ACT, a write command WR, a read command RD, and a refresh command REF, generate an address signal applied with the mode set command MRS as a mode set code OPC, generate an address signal applied with the active command ACT as a row address RADD, and generate an address signal applied with the write command WR or the read command RD as a column address CADD.

The mode set register 22 may store the mode set code OPC in response to the mode set command MRS. The mode set code OPC may include a burst length BL, a CRC enable signal CRCEN, and a data bus inversion enable signal DBIEN.

The refresh counter 24 may perform a counting operation in response to the refresh command REF, and generate a refresh address rra. The refresh command REF may be externally applied or be internally generated.

The row address generator 26 may generate a row address signal ra based on the refresh address rra or the row address RADD in response to the active command ACT.

The column address generator 28 may take the column address CADD as input in response to the write command WR or the read command RD, and generate a first column address signal ca1 and a second column address signal ca2 in response to the burst length BL. When the burst length is 9, the column address generator 28 may sequentially generate q second column address signals ca2 by increasing or decreasing from the column address CADD.

The row decoder 30 may decode the row address signal ra and generate word selection signals w1.

The column decoder 32 may decode the first column address signal ca1 and generate column selection signals cs1.

The memory cell array 34 may store 2qn-bit data (including qn-bit upper data (a first data group) and qn-bit lower data (a second data group)) to memory cells (not shown) selected by one from among the word selection signals w1 and one from among the column selection signals cs1 in response to the write command WR, or output 2qn-bit data (including qn-bit upper data (a third data group) and qn-bit lower data (a fourth data group)) from the selected memory cells (not shown) in response to the read command RD. As used herein, the term "qn" refers to a quantity of q times n, where q and n are positive integers. Further, the memory cell array 34 may perform a refresh operation on the selected memory cells (not shown) in response to the refresh command REF. The memory cell array 34 may store only the qn-bit lower data (the second data group), or output only the qn-bit lower data (the fourth data group) in response to a control signal con. Moreover, the memory cell array 34 may not perform the refresh operation on a portion of the memory cell array 34 storing or outputting the qn-bit upper data (the first data group or the third data group) in response to the control signal con.

The array voltage generator 36 may take as input the power supply voltage VDD, the ground voltage VSS, and/or the high voltage VPP, etc. which are externally applied and generate a memory cell array voltage Va. The array voltage generator 36 may be disabled in response to the control signal con, and may not apply the memory cell array voltage Va to the portion of the memory cell array 34. The memory cell array voltage Va may include various voltages used for an operation of the memory cell array 34.

The UDQ writer 38-1 may sequentially take as input the n-bit upper data and the 1-bit upper data bus inversion signal output from the UDQ input unit 42-1 by the number of times corresponding to q which is the burst length BL, and output the qn-bit upper data and the q-bit upper data bus inversion signal (the q-bit upper data bus inversion signal may be included in the first data group) in parallel. Further, the UDQ writer 38-1 may take as input the n-bit upper CRC related to the qn-bit upper data and the q-bit upper data bus inversion signal output from the UDQ input unit 42-1. The UDQ writer 38-1 may be disabled in response to the control signal con.

The LDQ writer 38-2 may sequentially take as input the n-bit lower data and the 1-bit lower data bus inversion signal output from the LDQ input unit 42-2 by the number of times corresponding to q which is the burst length BL, and output the qn-bit lower data and the q-bit lower data bus inversion signal (the q-bit lower data bus inversion signal may be included in the second data group) in parallel. Further, the LDQ writer 38-2 may take as input the n-bit lower CRC related to the qn-bit lower data and the q-bit lower data bus inversion signal output from the LDQ input unit 42-2.

The UDQ reader 40-1 may take as input the qn-bit upper data (the third data group) among the 2qn-bit data output from the memory cell array 34 in parallel, and sequentially output the n-bit upper data by q times in response to the second column address signal ca2. The UDQ reader 40-1 may be disabled in response to the control signal con.

The LDQ reader 40-2 may take as input the qn-bit lower data (the fourth data group) output from the memory cell array 34 in parallel, and sequentially output the n-bit lower data by q times in response to the second column address signal ca2.

The UDQ input unit 42-1 may buffer and output the n-bit upper data UDQ and the 1-bit upper data bus inversion signal UDBIB applied with the upper data strobe signal UDQS. The UDQ input unit 42-1 may buffer and output the n-bit upper CRC input through the upper data terminals UDQP. The UDQ input unit 42-1 may be disabled in response to the control signal con.

The LDQ input unit 42-2 may buffer and output the n-bit lower data LDQ and the 1-bit lower data bus inversion signal LDBIB applied with the lower data strobe signal LDQS. The LDQ input unit 42-2 may buffer and output the n-bit CRC input through the lower data terminals LDQP.

The UDQ output unit 44-1 may buffer the n-bit upper data output from the UDQ reader 40-1, and output the buffered n-bit upper data to the upper data terminals UDQP. The UDQ output unit 44-1 may be disabled in response to the control signal con.

The LDQ output unit 44-2 may buffer the n-bit lower data output from the LDQ reader 40-2, and output the buffered n-bit lower data to the lower data terminals LDQP.

The CRC calculator 46 may be enabled in response to the CRC enable signal CRCEN, perform an upper CRC logical operation using the qn-bit upper data and the q-bit upper data bus inversion signal (the first data group) output from the UDQ writer 38-1, generate an n-bit upper internal CRC, perform a lower CRC logical operation using the qn-bit lower data and the q-bit lower data bus inversion signal (the second data group) output from the LDQ writer 38-2, generate an n-bit lower internal CRC, compare the upper CRC and the upper internal CRC, generate an upper CRC result signal crc1, compare the lower CRC and the lower internal CRC, and generate a lower CRC result signal crc2. The CRC calculator 46 may not perform the upper CRC logical operation in response to the control signal con, and fix the upper CRC result signal crc1 to a logic level indicating that there is no error.

The error signal generator 48 may combine (perform a logical AND operation on) the upper CRC result signal crc1 and the lower CRC result signal crc2, and generate an error signal ALERT.

The CRC calculator 46 and the error signal generator 48 may generate the error signal ALERT according to the lower CRC result signal crc2 regardless of the upper CRC result signal crc1 in response to the control signal con.

The control signal generator 50 may generate the control signal con when the terminals related to the n-bit upper data of the x2n DRAM device 200 are not used (when data is not input and output through the terminals related to the n-bit upper data of the x2n DRAM device 200).

In FIG. 3, the UDQ writer 38-1 and the UDQ input unit 42-1 may configure a first data write path unit, the LDQ writer 38-2 and the LDQ input unit 42-2 may configure a second data write path unit, and the CRC calculator 46 and the error signal generator 48 may configure a CRC unit.

In the above description, the n-bit upper data may be an ECC.

The x2n DRAM device 200 shown in FIGS. 2 and 3 may be a double data rate (DDR) 4 DRAM device.

In FIGS. 2 and 3, when the terminals related to the n-bit upper data of the x2n DRAM device 200 are not used (when data is not input and output through the terminals related to the n-bit upper data of the x2n DRAM device 200), the x2n DRAM device 200 may be configured to fully control the memory cell array 34, the array voltage generator 36, the UDQ writer 38-1, the UDQ input unit 42-1, the UDQ reader 40-1, the UDQ output unit 44-1, and/or the CRC calculator 46, in response to the control signal con, but may be configured to control at least one from among the blocks.

FIG. 4 is a table representing data and a CRC applied through data terminals and a data bus inversion signal terminal of an x2n DRAM device according to an example embodiment of the inventive concepts.

The table shown in FIG. 4 illustrates pieces of lower data d0 to d71, lower data bus inversion signals d64 to d71, and lower CRCs CRC0 to CRC7 applied through the lower data terminals LDQP0 to LDQP7 and the lower data bus inversion signal terminal LDBIBP, and pieces of upper data d72 to d135, upper data bus inversion signals d136 to d143, and upper CRCs CRC8 to CRC15 applied through the upper data terminals UDQP0 to UDQP7 and the upper data bus inversion signal terminal UDBIBP, when the burst length BL of the x2n DRAM device is set to 8. Referring to FIG. 4, the 8-bit lower data and the 1-bit lower data bus inversion signal may be sequentially input by the number of times (from the first (0) to the eighth (7)) corresponding to 8 which is the burst length BL through the pieces of lower data terminals LDQP0 to LDQP7 and the lower data bus inversion signal terminal LDBIBP. That is, the pieces of 64-bit lower data d0 to d63 and the 8-bit lower data bus inversion signal d64 to d71 may be input. In the ninth time, the pieces of 8-bit lower CRC CRC0 to CRC7 related to a total of the pieces of 64-bit lower data d0 to d63 and the 8-bit lower data bus inversion signals d64 to d71 may be input through the lower data terminals LDQP0 to LDQP7.

Similarly, the 8-bit upper data and the 1-bit upper data bus inversion signal may be sequentially input by the number of times (from the first (0) to the eighth (7)) corresponding to 8 which is the burst length BL through the upper data terminals UDQP0 to UDQP7 and the upper data bus inversion signal terminal UDBIBP. That is, the pieces of 64-bit upper data d72 to d135 and the 8-bit upper data bus inversion signals d136 to d143 may be input.

In the tenth time, "1" indicating a CRC function being enabled may be input through the lower data terminals LDQP and the upper data terminals UDQP. In the ninth time and the tenth time, "1" indicating a data bus inversion (DBI) function being enabled may be input through the lower data bus inversion signal terminal LDBIBP and the lower data bus inversion signal terminal UDBIBP.

In the table shown in FIG. 4, the pieces of lower data d0 to d71 may be included in the first data group, and the lower data bus inversion signals d64 to d71 may be further included in the first data group. The pieces of upper data d72 to d135 may be included in the second data group, and the upper data bus inversion signals d136 to d143 may be further included in the second data group.

The table shown in FIG. 4 may be a DDR4 DRAM specification standardized by the Joint Electron Device Engineering Council (JEDEC), and the upper and lower data, the upper and lower data bus inversion signals, and the CRC may be input in a DDR format from the memory controller 11 shown in FIG. 1.

Figure 5:
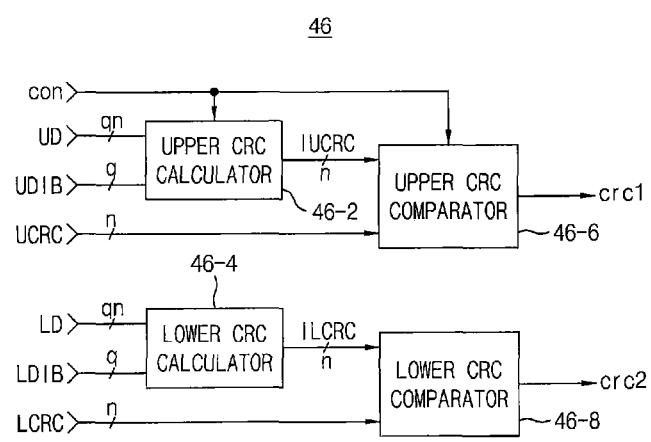
FIG. 5 is a block diagram illustrating a configuration of a CRC calculator according to an example embodiment of the inventive concepts.

FIG. 5 is a block diagram illustrating a configuration of the CRC calculator 46 according to an example embodiment of the inventive concepts. The CRC calculator 46 may include an upper CRC calculator 46-2, a lower CRC calculator 46-4, an upper CRC comparator 46-6, and a lower CRC comparator 46-8.

Referring to FIGS. 2 to 4, a function of each of the blocks shown in FIG. 5 will be described below.

The upper CRC calculator 46-2, the lower CRC calculator 46-4, the upper CRC comparator 46-6, and the lower CRC comparator 46-8 may be enabled in response to the CRC enable signal CRCEN, and perform the CRC logical operation. The upper CRC calculator 46-2 and the upper CRC comparator 46-6 may be disabled in response to the control signal con, and may not perform the upper CRC logical operation.

The upper CRC calculator 46-2 may receive as input qn-bit upper data UD and a q-bit upper data bus inversion signal UDIB (the first data group) output from the UDQ writer 38-1, may perform the upper CRC logical operation, and may generate an n-bit upper internal CRC IUCRC. For example, n may be 8, and q may be 8.

The lower CRC calculator 46-4 may receive as input qn-bit lower data LD and a q-bit lower data bus inversion signal LDIB (the second data group), may perform the lower CRC logical operation, and may generate an n-bit lower internal CRC ILCRC.

The upper CRC comparator 46-6 may compare the n-bit upper CRC UCRC and the n-bit upper internal CRC IUCRC, and generate the upper CRC result signal crc1. The upper CRC comparator 46-6 may fix the upper CRC result signal crc1 to a logic level indicating that there is no error in response to the control signal con.

The lower CRC comparator 46-8 may compare the n-bit lower CRC LCRC and the n-bit lower internal CRC ILCRC, and generate the lower CRC result signal crc2.

FIG. 6 illustrates a logical equation of the lower CRC calculator 46-4 according to an example embodiment of the inventive concepts. In FIG. 6, the operator "^" represents an Exclusive-OR (XOR) operator.

The lower CRC calculator 46-4 may perform an XOR operation on the pieces of lower data and the lower data bus inversion signals shown in the table shown in FIG. 4 according to the logical equations ILCRC0 to ILCRC7 shown in FIG. 6, and generate the 8-bit lower internal CRCs ILCRC0 to ILCRC7. That is, the lower internal CRC ILCRC may include the 8-bit lower internal CRCs ILCRC0 to ILCRC7.

Although not shown, the upper CRC calculator 46-2 may perform an XOR operation on the pieces of upper data and the upper data bus inversion signal, and generate the 8-bit upper internal CRCs IUCRC0 to IUCRC7 (not shown).

The logical equations shown in FIG. 6 may be the logical equations standardized by JEDEC.

As described above with reference to FIGS. 2 and 3, the upper data terminals UDQP, the upper data strobe signal terminal UDQSP, and the upper data bus inversion signal terminal UDBIBP related to the unused n-bit upper data UDQ of the x2n DRAM device 200 may remain in the floating state, or be fixed to the predetermined voltage. In this case, since the CRC enable signal CRCEN is in an enabled state, the upper CRC calculator 46-2 and the upper CRC comparator 46-6 shown in FIG. 5 may perform the upper CRC logical operation and generate a logic level indicating an error, but may be disabled in response to the control signal con and fix the upper CRC result signal crc1 to a logic level indicating no error. Accordingly, the error signal generator 48 shown in FIG. 2 may generate the error signal ALERT based on the lower CRC result signal crc2 regardless of the upper CRC result signal crc1.

In the above description, the CRC calculator 46 and the upper CRC calculator 46-2 may perform the upper CRC operation using the qn-bit upper data and the q-bit upper data bus inversion signal (the first data group), and generate the n-bit upper internal CRC, and the CRC calculator 46 and the lower CRC calculator 46-4 may perform the lower CRC operation using the qn-bit lower data and the q-bit lower data bus inversion signal (the second data group), and generate the n-bit lower internal CRC. However, the CRC calculator 46 and the upper CRC calculator 46-2 may perform the upper CRC logical operation on the qn-bit upper data excluding the q-bit upper data bus inversion signal (the first data group), and generate the upper internal CRC, and the CRC calculator 46 and the lower CRC calculator 46-4 may perform the lower CRC logical operation on the qn-bit lower data excluding the q-bit lower data bus inversion signal (the second data group), and generate the lower internal CRC.

Figure 7:
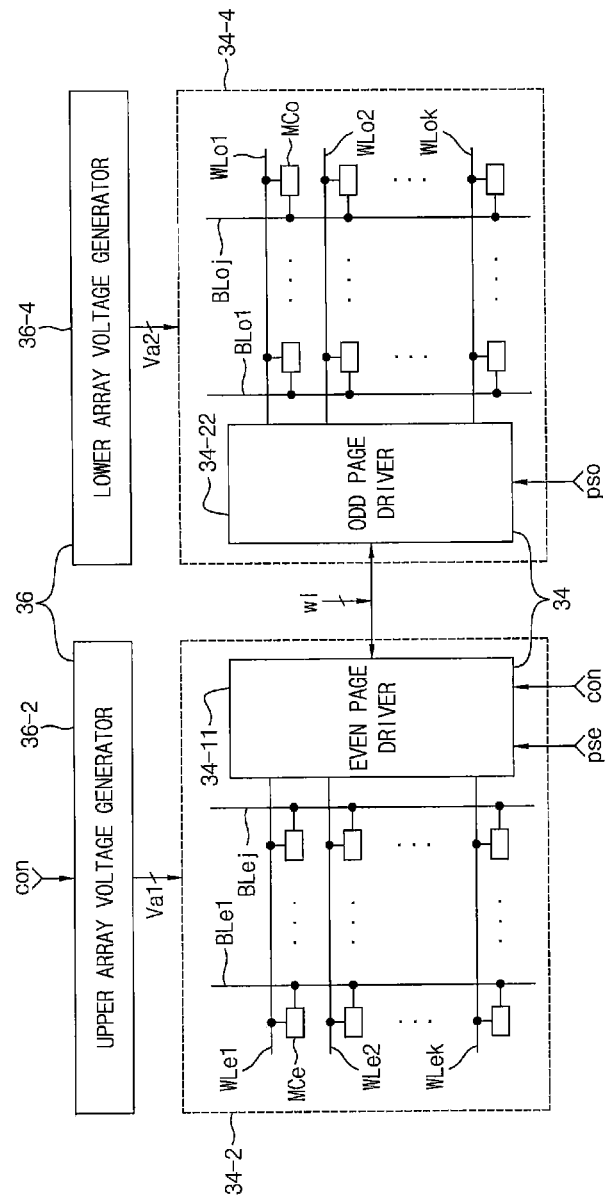
FIG. 7 is a schematic diagram illustrating a memory cell array and an array voltage generator according to an example embodiment of the inventive concepts.

FIG. 7 is a schematic diagram illustrating the memory cell array 34 and the array voltage generator 36 according to the example embodiment of the inventive concepts.

Referring to FIG. 7, the memory cell array 34 may include an upper memory cell array 34-2 and a lower memory cell array 34-4. The array voltage generator 36 may include an upper array voltage generator 36-2 and a lower array voltage generator 36-4.

The upper memory cell array 34-2 may include a plurality of even memory cells MCe arranged between even word lines WLe1 to WLek and even bit lines BLe1 to BLej, and an even page driver 34-11, and the lower memory cell array 34-4 may include a plurality of odd memory cells MCo arranged between odd word lines WLo1 to WLok and odd bit lines BLo1 to BLoj, and an odd page driver 34-22.

A function of each of the blocks shown in FIG. 7 will be described below with reference to FIG. 2.

The upper array voltage generator 36-2 may generate an upper array voltage Va1. The upper array voltage generator 36-2 may be disabled in response to the control signal con, and may not generate an upper array voltage Va1. The lower array voltage generator 36-4 may generate a lower array voltage Va2. The voltage Va shown in FIG. 2 may include the upper array voltage Va1 and the lower array voltage Va2.

The even page driver 34-11 may be enabled in response to an even page selection signal pse, and select one from among the even word lines WLe1 to WLek in response to the word selection signals w1. The even page driver 34-11 may be disabled in response to the control signal con regardless of the even page selection signal pse.

The upper memory cell array 34-2 may perform a write operation of writing the qn-bit upper data (the first data group) to a plurality of selected memory cells connected to one selected even word line and selected even bit lines in response to the write command WR, and perform a read operation of reading the qn-bit upper data (the third data group) from the plurality of selected memory cells in response to the read command RD. The upper memory cell array 34-2 may perform a refresh operation on a plurality of memory cells connected to at least one even word line selected in response to the refresh command REF. The upper memory cell array 34-2 may not perform the write operation, the read operation, and the refresh operation in response to the control signal con.

The odd page driver 34-22 may be enabled in response to an odd page selection signal pso, and select one from among the odd word lines WLo1 to WLok corresponding to the word selection signals w1.

The lower memory cell array 34-4 may perform a write operation of writing the qn-bit lower data (the second data group) to a plurality of selected memory cells connected to one selected odd word line and selected odd bit lines in response to the write command WR, and perform a read operation of reading the qn-bit lower data (the fourth data group) from the plurality of selected memory cells in response to the read command RD. The lower memory cell array 34-4 may perform a refresh operation on a plurality of memory cells connected to at least one odd word line selected in response to the refresh command REF.

The even page selection signal pse and the odd page selection signal pso may be activated by an uppermost bit signal of the column address. One of the even page selection signal pse and the odd page selection signal pso may be activated in response to the uppermost bit signal of the column address. In this case, one of the upper memory cell array 34-2 and the lower memory cell array 34-4 may write or read the qn-bit data. Further, both of the even page selection signal pse and the odd page selection signal pso may be activated regardless of the uppermost bit signal of the column address. In this case, the upper memory cell array 34-2 and the lower memory cell array 34-4 may write the 2qn-bit data (the first and second data groups), or read the 2qn-bit data (the third and fourth data groups). The upper memory cell array 34-2 may be disabled in response to the control signal con regardless of the even page selection signal pse, and may not write or read the qn-bit upper data (the first or third data group) and may not perform the refresh operation.

When the upper data terminals UDQP, the upper data strobe signal terminal UDQSP, and/or the upper data bus inversion signal terminal UDBIBP related to the n-bit upper data UDQ of the x2n DRAM device 200 are not used (when data is not input and output through the upper data terminals UDQP, the upper data strobe signal terminal UDQSP, and/or the upper data bus inversion signal terminal UDBIBP), the upper array voltage generator 36-2 may be disabled in response to the control signal con, and may not apply the upper array voltage Va1 to the upper memory cell array 34-2. Further, the even page driver 34-11 may be disabled in response to the control signal con, and the upper memory cell array 34-2 may not perform the write operation, the read operation, and/or the refresh operation.

In FIG. 7, each of the upper memory cell array 34-2 and the lower memory cell array 34-4 may be a memory block, a memory bank, or a memory rank.

Figure 8:
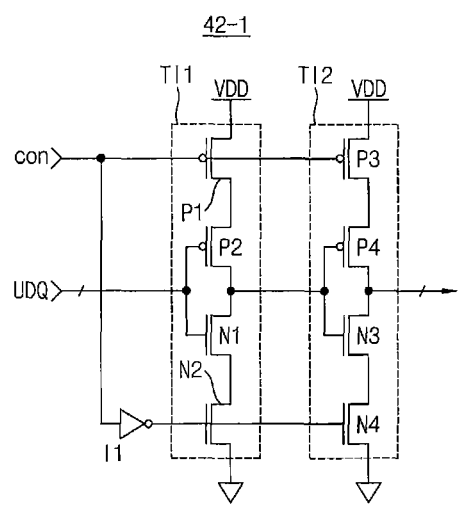
FIG. 8 is a diagram illustrating a configuration of an upper data input unit according to an example embodiment of the inventive concepts.

FIG. 8 is a diagram illustrating a configuration of the UDQ input unit 42-1 according to an example embodiment of the inventive concepts. The UDQ input unit 42-1 may include a first inverter I1, and first and second tri-state inverters TI1 and TI2. The first tri-state inverter TI1 may include first and second PMOS transistors P1 and P2 and first and second NMOS transistors N1 and N2, and the second tri-state inverter TI2 may include third and fourth PMOS transistors P3 and P4 and third and fourth NMOS transistors N3 and N4.

The first and second tri-state inverters TI1 and TI2 shown in FIG. 8 may be disabled when the first and third PMOS transistors P1 and P3 and the second and fourth NMOS transistors N2 and N4 are turned off in a case that the control signal con is in a "high" level, and may be enabled when the control signal con is in a "low" level.

The first tri-state inverter TI1 may be enabled when the first PMOS transistor P1 and the second NMOS transistor N2 are turned on and enabled in the case that the control signal con is in the "low" level, and the second PMOS transistor P2 and the first NMOS transistor N1 may invert and output the upper data UDQ.

The second tri-state inverter TI2 may be enabled when the third PMOS transistor P3 and the fourth NMOS transistor N4 are turned on in the case that the control signal con is in the "low" level, and the fourth PMOS transistor P4 and the third NMOS transistor N3 may invert and output an output signal of the first tri-state inverter TI1.

Figure 9:
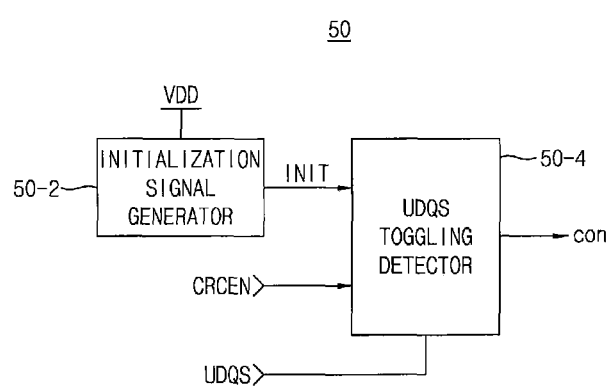
FIG. 9 is a diagram illustrating a configuration of a control signal generator according to an example embodiment of the inventive concepts.

FIG. 9 is a diagram illustrating a configuration of the control signal generator 50 according to an example embodiment of the inventive concepts. The control signal generator 50 may include an initialization signal generator 50-2 and a UDQS toggling detector 50-4.

A function of each of the blocks shown in FIG. 9 will be described below.

The initialization signal generator 50-2 may detect that a power supply voltage VDD reaches a predetermined level in power-up and generate an initialization signal INIT. As another example, the initialization signal INIT may be generated by detecting a first write command which is a write command WR which is first applied to the x2n DRAM device 200.

The UDQS toggling detector 50-4 may be initialized in response to the initialization signal INIT, generate the control signal con based on the CRC enable signal CRCEN output from the mode set register 22 shown in FIG. 1 when a toggling of the upper data strobe signal UDQS is detected, and fix the control signal con to the logic level for disabling the internal function blocks related to the upper data regardless of the CRC enable signal CRCEN when the toggling of the upper data strobe signal UDQS is not detected.

In the above description, the UDQS toggling detector 50-4 may detect that the upper data strobe signal UDQS is toggled. However, the UDQS toggling detector 50-4 may detect that the inverted upper data strobe signal UDQSB is toggled.

Figure 10:
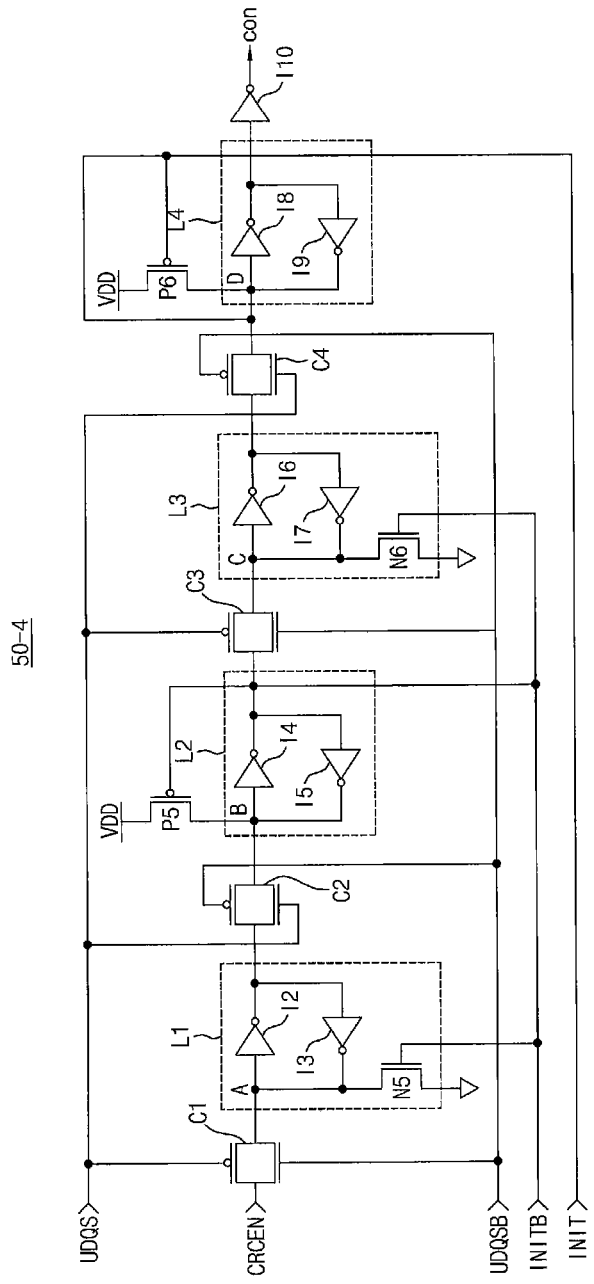
FIG. 10 is a diagram illustrating a configuration of an upper data strobe signal (UDQS) toggling detector according to an example embodiment of the inventive concepts.

FIG. 10 is a diagram illustrating a configuration of the UDQS toggling detector 50-4 according to the example embodiment of the inventive concepts. The UDQS toggling detector 50-4 may include first to fourth CMOS transmission gates C1 to C4, first to fourth latches L1 to L4, and a tenth inverter I10. The first latch L1 may include second and third inverters I2 and I3, and a fifth NMOS transistor N5, and the second latch L2 may include fourth and fifth inverters I4 and I5, and a fifth PMOS transistor P5. The third latch L3 may include sixth and seventh inverters I6 and I7, and a sixth NMOS transistor N6, and the fourth latch L4 may include eighth and ninth inverters I8 and I9, and a sixth PMOS transistor P6.

A function of each of elements shown in FIG. 10 will be described below.

The first and third CMOS transmission gates C1 and C3 may be turned on in response to the upper data strobe signal UDQS which is in a "low" level and the inverted data strobe signal UDQSB which is in a "high" level, and respectively transmit the CRC enable signal CRCEN and an output signal of the second latch L2.

The second and fourth CMOS transmission gates C2 and C4 may be turned on in response to the upper data strobe signal UDQS which is in the "high" level and the inverted upper data strobe signal UDQSB which is in the "low" level, and respectively transmit an output signal of the first latch L1 and an output signal of the third latch L3.

The fifth and sixth NMOS transistors N5 and N6 may respectively initialize a node A and a node C to the "low" level in response to an inverted initialization signal INITB which is in the "high" level.

The fifth and sixth PMOS transistors P5 and P6 may respectively initialize a node B and a node D to the "high" level in response to an initialization signal INIT which is in the "low" level.

The first to fourth latches L1 to L4 may latch, invert, and output signals of nodes A, B, C, and D, respectively. The first latch L1 may latch, invert, and output the signal of the node A by the second and third inverters I2 and I3. The second latch L2 may latch, invert, and output the signal of the node B by the fourth and fifth inverters I4 and I5. The third latch L3 may latch, invert, and output the signal of the node C by the sixth and seventh inverters I6 and I7. The fourth latch L4 may latch, invert, and output the signal of the node D by the seventh and eighth inverters I7 and I8.

The inverter I10 may invert the output signal of the fourth latch L4 and generate the control signal con.

Figure 11A:
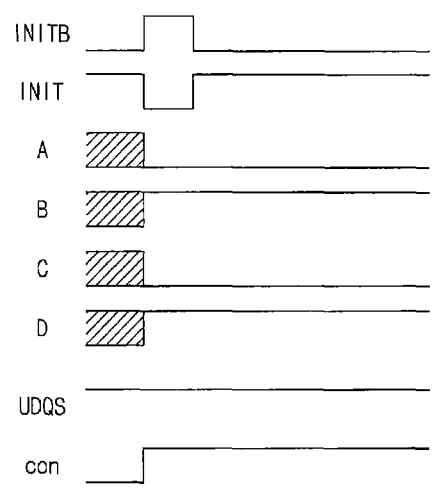
FIGS. 11A to 11C are timing diagrams for describing operations of an UDQS toggling detector according to an example embodiment of the inventive concepts.
Figure 11B:
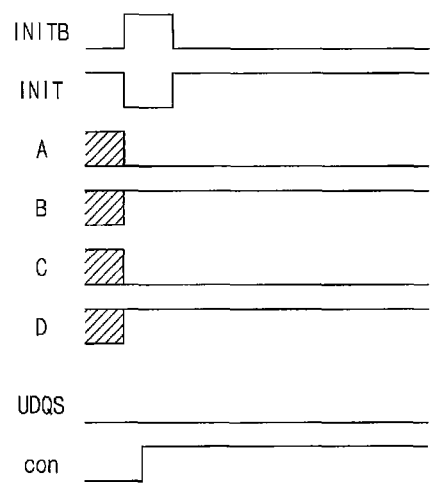
Figure 11C:
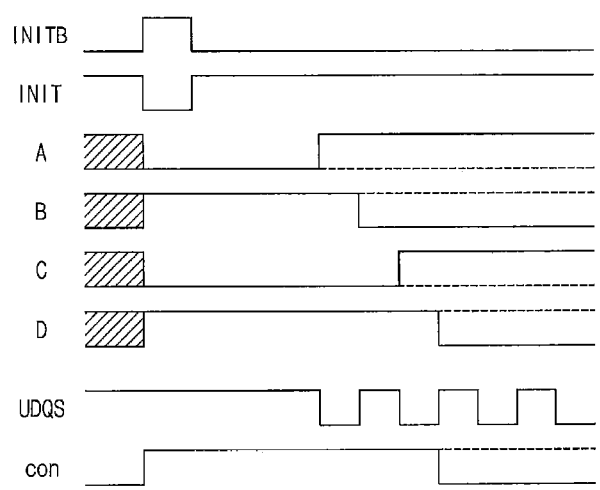

FIGS. 11A to 11C are timing diagrams for describing operations of the UDQS toggling detector 50-4 according to the example embodiment of the inventive concepts. FIG. 11A is a timing diagram for describing an operation of the UDQS toggling detector 50-4 when the upper data strobe signal terminal UDQSP is connected to a power supply voltage (when the upper data strobe signal UDQS is fixed to a "high" level), FIG. 11B is a timing diagram for describing an operation of the UDQS toggling detector 50-4 when the upper data strobe signal terminal UDQSP is connected to a ground voltage (when the upper data strobe signal UDQS is fixed to a "low" level), and FIG. 11C is a timing diagram for describing an operation of the UDQS toggling detector 50-4 when the upper data strobe signal UDQS is applied through the upper data strobe signal terminal UDQSP (when the upper data strobe signal UDQS is toggled).

Referring to FIGS. 10 and 11A to 11C, when the inverted initialization signal INITB is in the "high" level and the initialization signal INIT is in the "low" level, the fifth and sixth NMOS transistors N5 and N6 of the first and third latches L1 and L3 may be turned on and the nodes A and C may be initialized to the "low" level, and the fifth and sixth PMOS transistors P5 and P6 of the second and fourth latches L2 and L4 may be turned on and the nodes B and D may be initialized to the "high" level.

Referring to FIGS. 10, 11A and 11C, when the upper data strobe signal UDQS is in the "high" level, the first and third CMOS transmission gates C1 and C3 may be turned off, the CRC enable signal CRCEN may not be transmitted, and the signal which is in the "high" level of the node D may be generated as the control signal con.

Referring to FIGS. 10 and 11B, when the upper data strobe signal UDQS is in the "low" level, the second and fourth CMOS transmission gates C2 and C4 may be turned off, the CRC enable signal CRCEN may not be transmitted, and the signal which is in the "high" level of the node D may be generated as the control signal con.

Referring to FIGS. 10, 11A, and 11B, when the upper data strobe signal UDQS is not toggled, the control signal con which is in the "high" level may be generated regardless of the logic level of the CRC enable signal CRCEN.

In FIG. 11C, solid lines represent an operational timing diagram when the CRC enable signal CRCEN is in the "high" level (indicating that the CRC function is enabled), and dotted lines represent an operational timing diagram when the CRC enable signal CRCEN is in the "low" level (indicating that the CRC function is disabled).

Referring to the timing diagram shown as the solid lines in FIGS. 10 and 11C, when the upper data strobe signal UDQS is transitioned to the "low" level, the first CMOS transmission gate C1 may be turned on and transmit the CRC enable signal CRCEN which is in the "high" level to the node A. The first latch L1 may latch and invert the CRC enable signal CRCEN and generate an output signal which is in the "low" level. When the upper data strobe signal UDQS is transitioned to a "high" level, the second CMOD transmission gate C2 may be turned on, and transmit the output signal of the first latch L1 which is in the "low" level. The second latch L2 may latch and invert the output signal which is in the "low" level of the latch L1 and generate an output signal which is in the "high" level. When the upper data strobe signal UDQS is transitioned to the "low" level, the third CMOS transmission gate C3 may be turned on, and transmit an output signal which is in the "high" level of the second latch L2. The third latch L3 may latch and invert the output signal which is in the "high" level of the second latch L2 and generate an output signal which is in the "low" level. When the upper data strobe signal UDQS is transitioned to the "high" level, the fourth CMOS transmission gate C4 may be turned on, and transmit the output signal which is in the "low" level of the third latch L3. The fourth latch L4 may latch and invert the output signal which is in the "low" level of the third latch L3 and generate an output signal which is in the "high" level. The inverter I9 may invert the output signal which is in the "high" level of the latch L4 and generate the control signal con which is in the "low" level.

Accordingly, when the CRC enable signal CRCEN is in the "high" level and the upper data strobe signal UDQS is toggled, the control signal con which is in the "low" level may be generated.

Referring to the timing diagram shown as the dotted lines in FIGS. 10 and 11C, the CRC enable signal CRCEN which is in the "low" level may be transmitted, and thus the control signal con which is in the "high" level may be generated.

Referring to FIGS. 1, 2, 3, 10, and 11A to 11C as described above, the upper data strobe signal UDQS may be fixed to the "high" level or the "low" level by connecting the upper data strobe signal terminal UDQSP of the x2n DRAM device M5 to the power supply line (terminal) or the ground line (terminal) of the system board 15. The memory controller 11 may set the CRC enable signal CRCEN to the "high" level by applying the mode set code OPC with the mode set command MRS to each of the x2n DRAM devices M1 to M5. Since lines of applying the command and address CA are shared by the memory controller 11 and the x2n DRAM devices M1 to M5, an independent CRC enable signal CRCEN for each of the DRAM devices M1 to M5 may not be set. When the upper data strobe signal UDQS is toggled as shown in FIG. 11C, each of the x2n DRAM devices M1 to M5 may generate the control signal con which is in the "low" level. Each of the DRAM devices M1 to M5 may enable the internal function blocks related to the upper data in response to the control signal con which is in the "low" level. On the other hand, since the upper data strobe signal UDQS is fixed to the "high" level or the "low" level as shown in FIGS. 11A and 11B, the x2n DRAM device M5 may generate the control signal con which is in the "high" level. The x2n DRAM device M5 may disable the internal function blocks related to the upper data in response to the control signal con which is in the "high" level regardless of the CRC enable signal CRCEN.

According to example embodiments of the inventive concepts, a control signal may be generated when terminals related to upper data of a DRAM device are not used (when data is not input and output through the terminals), and an erroneous error signal may not be generated by generating an error signal based on a lower CRC result signal regardless of an upper CRC result signal in response to the control signal.

Further, according to example embodiments of the inventive concepts, a DRAM device may disable internal function blocks related to upper data in response to a control signal. Accordingly, the DRAM device and a memory system having the same may reduce power consumption.

It will be understood that although the terms "first," "second," etc. are used herein to describe members, regions, layers, portions, sections, components, and/or elements in example embodiments of the inventive concepts, the members, regions, layers, portions, sections, components, and/or elements should not be limited by these terms. These terms are only used to distinguish one member, region, portion, section, component, or element from another member, region, portion, section, component, or element. Thus, a first member, region, portion, section, component, or element described below may also be referred to as a second member, region, portion, section, component, or element without departing from the scope of the inventive concepts. For example, a first element may also be referred to as a second element, and similarly, a second element may also be referred to as a first element, without departing from the scope of the inventive concepts.

The terminology used herein is for the purpose of describing particular embodiments only and is not intended to be limiting of example embodiments. As used herein, the singular forms "a," "an," and "the" are intended to include the plural forms as well, unless the context clearly indicates otherwise. It will be further understood that the terms "comprises," "comprising," "includes," and/or "including," if used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by those of ordinary skill in the art to which the inventive concepts pertain. It will also be understood that terms, such as those defined in commonly used dictionaries, should be interpreted as having a meaning that is consistent with their meaning in the context of this specification and the relevant art and will not be interpreted in an idealized or overly formal sense unless expressly so defined herein.

As used herein, the term "and/or" includes any and all combinations of one or more of the associated listed items. Expressions such as "at least one of," when preceding a list of elements, modify the entire list of elements and do not modify the individual elements of the list.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements or layers should be interpreted in a like fashion (e.g., "between" versus "directly between," "adjacent" versus "directly adjacent," "on" versus "directly on").

Like numbers refer to like elements throughout. Thus, the same or similar numbers may be described with reference to other drawings even if they are neither mentioned nor described in the corresponding drawing. Also, elements that are not denoted by reference numbers may be described with reference to other drawings.

While the embodiments of the inventive concepts have been described with reference to the accompanying drawings, it should be understood by those skilled in the art that various modifications may be made without departing from the scope of the inventive concepts and without changing essential features thereof. Therefore, the above-described embodiments should be considered in a descriptive sense only and not for purposes of limitation.

What is claimed is:

1. A memory system comprising:
a system board;
a memory controller on the system board;
first to fifth memory devices on the system board, each of the first to fifth memory devices comprising eight lower data terminals (LDQPs), eight upper data terminals (UDQPs), a lower data strobe terminal (LDQSP), an upper data strobe terminal (UDQSP), a lower data bus inversion terminal (LDBIP), an upper data bus inversion terminal (UDBIP), and an alert terminal (ALERTP), and each of the first to fifth memory devices further comprising a control signal generator configured to generate a control signal and a cyclic redundancy code (CRC) unit configured to perform a first CRC logical operation on a first data group received through the LDQPs and the LDBIP of each memory device for generating a first CRC result signal and, in response to the control signal, to perform a second CRC logical operation on a second data group received through the UDQPs and the UDBIP of each memory device for generating a second CRC result signal, wherein, during a write operation of the memory devices, the control signal of each of the first to fourth memory devices is set to have a first logic value and the control signal of the fifth memory device is set to have a second logic value, respectively;
seventy-two data lines connected between the memory controller and the LDQPs and UDQPs of the first to fourth memory devices and the LDQPs of the fifth memory device;
nine data strobe lines connected between the memory controller and the LDQSPs and UDQSPs of the first to fourth memory devices and the LDQSP of the fifth memory device;
nine data bus inversion lines connected between the memory controller and the LDBIPs and the UDBIPs of the first to fourth memory devices and the LDBIP of the fifth memory device; and
an alert line connected between the memory controller and the ALERTPs of the first to fourth memory devices,
wherein each of the first to fourth memory devices performs the second CRC logical operation in response to the first logic value of the control signal while the fifth memory device does not perform the second CRC logical operation in response to the second logic value of the control signal.

2. The memory system of claim 1, wherein the CRC unit of each memory device is configured to assert an alert signal through the ALERTP when the first CRC result signal and/or the second CRC result signal indicates a CRC error.

3. The memory system of claim 2, wherein the second CRC result signal does not indicate the CRC error when the second CRC logical operation is not performed.

4. The memory system of claim 1, wherein the UDBIP of the fifth memory device is fixed to a power voltage.

5. The memory system of claim 1, wherein the UDQPs and the UDQSP of the fifth memory device are fixed to a ground voltage.

6. The memory system of claim 5, wherein, during the write operation of the memory devices, the control signal of each of the first to fourth memory devices is set to have the first logic value by detecting a transition of a data strobe signal received through the UDQSP of the corresponding memory device, and the control signal of the fifth memory device is set to have the second logic value by detecting a ground level of the UDQSP.

7. The memory system of claim 6, wherein a read/write control circuit coupled to the UDQPs of the fifth memory device does not operate when the control signal of the fifth memory device is set to have the second logic value.

8. The memory system of claim 6, wherein output driver circuits coupled to the UDQPs of the fifth memory device are disabled when the control signal of the fifth memory device is set to have the second logic value.

9. The memory system of claim 1, wherein data received through the LDQPs of the fifth memory device are used for an error correction code (ECC) operation.

10. The memory system of claim 1, wherein the first to fifth memory devices are identical DDR4 synchronous dynamic random access memory (SDRAM) devices.

11. A memory system comprising:
a system board;
a memory controller on the system board;
first to fifth memory devices on the system board, each of the first to fifth memory devices comprising eight lower data terminals (LDQPs), eight upper data terminals (UDQPs), a lower data strobe terminal (LDQSP), an upper data strobe terminal (UDQSP), a lower data bus inversion terminal (LDBIP), an upper data bus inversion terminal (UDBIP), and an alert terminal (ALERTP), and each of the first to fifth memory devices further comprising a control signal generator configured to generate a control signal and a cyclic redundancy code (CRC) unit configured to perform a first CRC logical operation on a first data group received through the LDQPs and the LDBIP of each memory device for generating a first CRC result signal and, in response to the control signal, to perform a second CRC logical operation on a second data group received through the UDQPs and the UDBIP of each memory device for generating a second CRC result signal, wherein, during read operation of the memory devices, the control signal of each of the first to fourth memory devices is set to have a first logic value and the control signal of the fifth memory device is set to have a second logic value, respectively;

seventy-two data lines connected between the memory controller and the LDQPs and UDQPs of the first to fourth memory devices and the LDQPs of the fifth memory device;

nine data strobe lines connected between the memory controller and the LDQSPs and UDQSPs of the first to fourth memory devices and the LDQSP of the fifth memory device;

nine data bus inversion lines connected between the memory controller and the LDBIPs and the UDBIPs of the first to fourth memory devices and the LDBIP of the fifth memory device; and an alert line connected between the memory controller and the ALERTPs of the first to fourth memory devices, wherein, during a read operation of the memory devices, output drivers driving the UDQPs of the fifth memory device are turned off in response to the second logic value of the control signal.

12. The memory system of claim 11, wherein, during the read operation of the memory devices, the output drivers driving the LDQPs of the fifth memory device perform a normal driving operation in response to the first logic value of the control signal.

13. The memory system of claim 11, wherein the UDBIP of the fifth memory device is fixed to a ground voltage.

14. The memory system of claim 13, wherein the UDQPs and the UDQSP of the fifth memory device is fixed to the ground voltage.

15. The memory system of claim 13, wherein the UDQPs and the UDQSP of the fifth memory device are fixed to a power voltage.

16. The memory system of claim 13, wherein, during the read operation of the memory devices, the control signal of each of the first to fourth memory devices is set to have the first logic value by detecting a transition of a data strobe signal of the corresponding memory device, and the control signal of the fifth memory device is set to have the second logic value by detecting a ground voltage or a power voltage of the UDQSP of the fifth memory device.

17. The memory system of claim 16, wherein a read/write control circuit coupled to the UDQPs of the fifth memory device does not operate when the control signal of the fifth memory device is set to have the second logic value.

18. The memory system of claim 17, wherein the CRC unit of each of the memory devices is configured to assert an alert signal through the ALERTP when the first CRC result signal and/or the second CRC result signal indicates a CRC error, and wherein the second CRC result signal does not indicate the CRC error when the control signal is set to have the second logic value.

19. The memory system of claim 11, wherein data received through the LDQPs of the fifth memory device are used for error correction code (ECC) operation.

20. The memory system of claim 11, wherein the first to fifth memory devices are identical DDR4 synchronous dynamic random access memory (SDRAM) devices.

* * * * *